United States Patent
Hattori et al.

(10) Patent No.: US 8,369,375 B2
(45) Date of Patent: Feb. 5, 2013

(54) SEMICONDUCTOR LIGHT-EMITTING DEVICE

(75) Inventors: Yasushi Hattori, Kawasaki (JP); Rei Hashimoto, Tokyo (JP); Shinji Saito, Yokohama (JP); Maki Sugai, Tokyo (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/729,636

(22) Filed: Mar. 23, 2010

(65) Prior Publication Data

US 2010/0246628 A1  Sep. 30, 2010

(30) Foreign Application Priority Data

Mar. 24, 2009  (JP) ................ 2009-072478

(51) Int. Cl.
 *H01S 3/04* (2006.01)
 *H01S 5/00* (2006.01)
 *H01S 3/091* (2006.01)

(52) U.S. Cl. ............ 372/80; 372/36; 372/50.23

(58) Field of Classification Search ........... 372/36, 372/80, 50.23
See application file for complete search history.

(56) References Cited

U.S. PATENT DOCUMENTS

| | | | |
|---|---|---|---|
| 7,525,127 B2 | 4/2009 | Hattori et al. | |
| 2008/0116473 A1* | 5/2008 | Sugiyama | 257/98 |
| 2008/0169752 A1 | 7/2008 | Hattori et al. | |
| 2009/0058256 A1 | 3/2009 | Mitsuishi et al. | |
| 2009/0185589 A1 | 7/2009 | Hattori et al. | |
| 2009/0321771 A1 | 12/2009 | Hattori et al. | |
| 2010/0053970 A1 | 3/2010 | Sato et al. | |
| 2010/0148203 A1* | 6/2010 | Hashimoto et al. | 257/98 |

FOREIGN PATENT DOCUMENTS

| | | | |
|---|---|---|---|
| JP | 2000-150991 | | 5/2000 |
| JP | 2006-73202 | | 3/2006 |
| JP | 2007-158009 | | 6/2007 |
| JP | 2007-158991 | | 6/2007 |
| JP | 2008-153617 | | 7/2008 |
| JP | 2008-235744 | * | 10/2008 |
| JP | 2009-260053 | * | 11/2009 |
| JP | 2009-272576 | * | 11/2009 |
| JP | 2009-289976 | * | 12/2009 |
| JP | 2010-199357 | * | 9/2010 |
| WO | WO 2007/105647 A1 | | 9/2007 |

OTHER PUBLICATIONS

U.S. Appl. No. 12/638,354, filed Dec. 15, 2009, Rei Hashimoto et al.
U.S. Appl. No. 12/874,778, filed Sep. 2, 2010, Saito, et al.
U.S. Appl. No. 12/876,675, filed Sep. 7, 2010, Hattori, et al.
U.S. Appl. No. 12/876,774, filed Sep. 7, 2010, Hattori, et al.
U.S. Appl. No. 12/876,738, filed Sep. 7, 2010, Hattori, et al.
Office Action issued Sep. 27, 2011, in Japanese Patent Application No. 2009-072478 with English translation.

* cited by examiner

*Primary Examiner* — Armando Rodriguez
(74) *Attorney, Agent, or Firm* — Oblon, Spivak, McClelland, Maier & Neustadt, L.L.P.

(57) ABSTRACT

Disclosed is a semiconductor light-emitting device including a package having a light outlet, a semiconductor laser diode disposed in the package and radiating a light having a first wavelength falling within a range of ultraviolet ray to visible light, and a visible-light-emitter containing a phosphor which absorbs a light radiated from the semiconductor laser diode and emits a visible light having a second wavelength differing from the first wavelength, the visible-light-emitter being disposed on an optical path of the laser diode and a peripheral edge of the visible-light-emitter being in contact with the package.

17 Claims, 6 Drawing Sheets

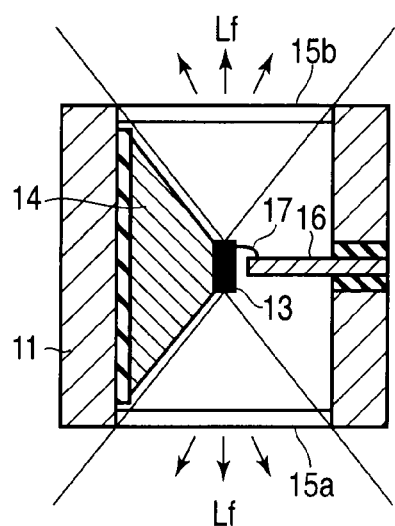
F I G. 1A
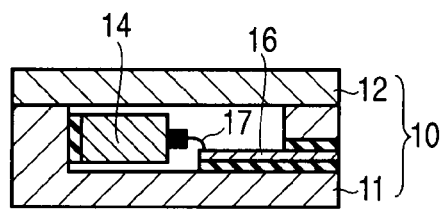
F I G. 1B
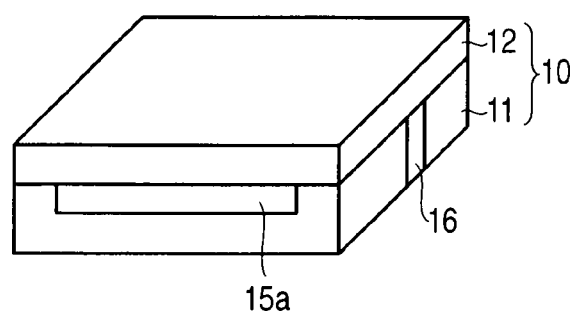
F I G. 1C

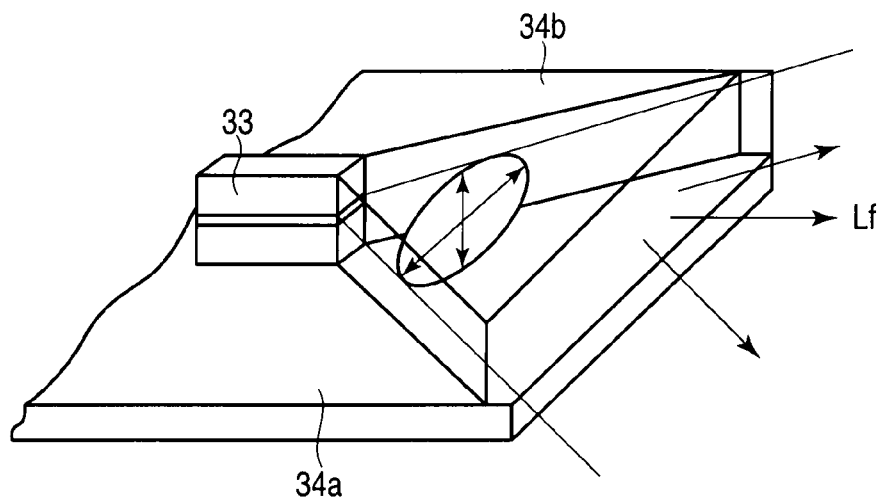
F I G. 6A
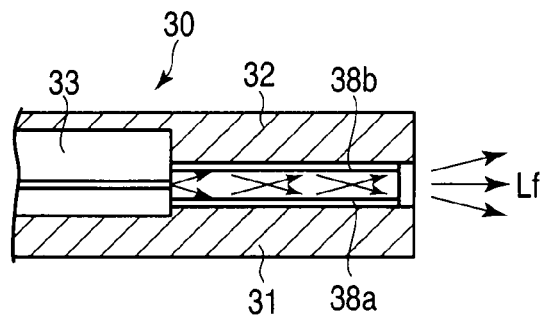
F I G. 6B
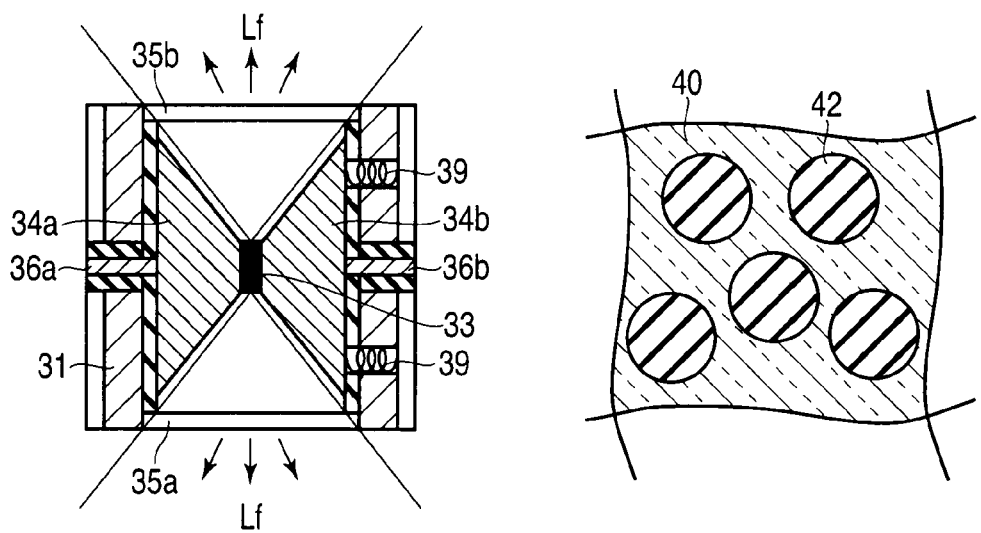
F I G. 7
F I G. 8

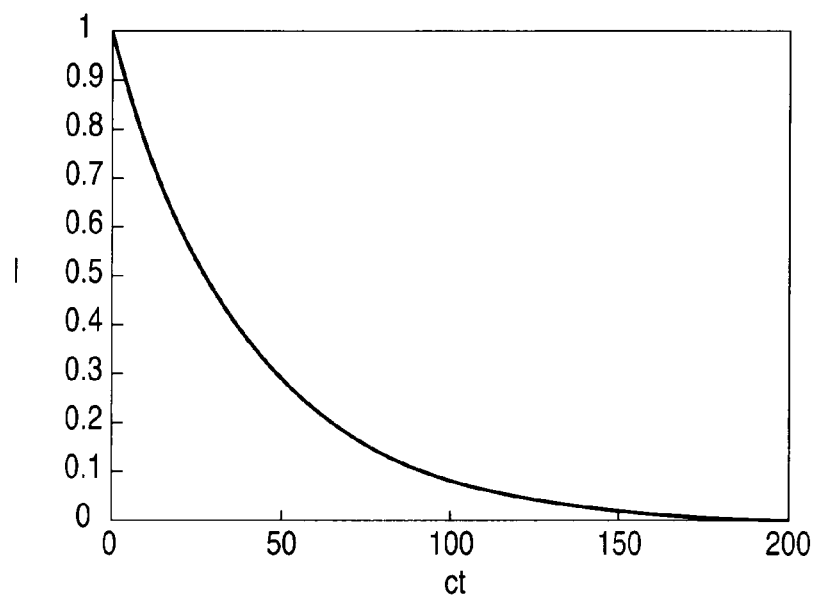
F I G. 9
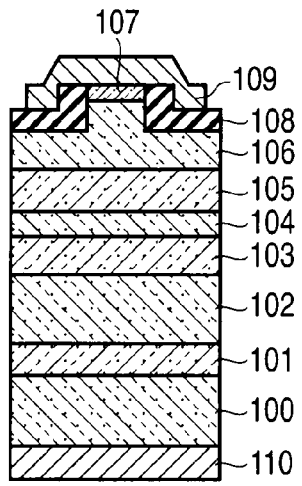
F I G. 10
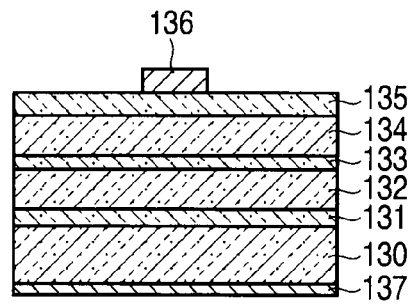
F I G. 11
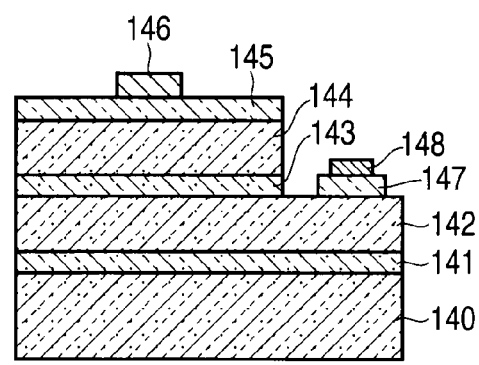
F I G. 12

SEMICONDUCTOR LIGHT-EMITTING DEVICE

CROSS-REFERENCE TO RELATED APPLICATIONS

This application is based upon and claims the benefit of priority from prior Japanese Patent Application No. 2009-072478, filed Mar. 24, 2009, the entire contents of which are incorporated herein by reference.

BACKGROUND OF THE INVENTION

1. Field of the Invention

This invention relates to a light-emitting device employing a semiconductor laser diode as a light source.

2. Description of the Related Art

Conventionally, there have been proposed various kinds of light source devices or light-emitting devices each having a combination of a semiconductor light-emitting element and a fluorescent material (see, for example, JP-A 2008-153617, 2007-158009 and 2006-73202). These light-emitting devices are designed such that an excitation light emitted from a semiconductor light-emitting element is absorbed by a fluorescent material, thereby enabling the fluorescent material to emit a light having a different wavelength from that of the excitation light.

In JP-A 2008-153617, there is proposed a semiconductor light-emitting device which includes a CAN type package and has a combination of a laser diode and a phosphor. Further, in JP-A 2007-158009, there is proposed a thin wall type semiconductor light-emitting device employing a light-emitting diode. Further, in JP-A 2006-73202, there is proposed a light-emitting device for lighting which is equipped with a semiconductor laser element radiating laser beam and with light-guiding plate having a phosphor coated on a light-retrieving face thereof, thereby enabling the light-emitting device to emit light from the surface thereof.

However, in the case of the light-emitting device disclosed in JP-A 2008-153617, although it is made possible to realize a high output because of the employment of a laser diode, the area of emission is circular and wide and there is not provided idea of increasing the luminance. Further, in the case of the light-emitting device disclosed in JP-A 2007-158009, although the light-emitting surface is made narrow to thereby allegedly make it possible to increase the luminance, it fails to create a light-emitting surface which is smaller than the size of the LED element. Further, if it is tried to increase the output of the light-emitting device, the emission area of the LED element per se is required to be increased, resulting in the limitation of any further increase in luminance. Further, in the case of the light-emitting device disclosed in JP-A 2006-73202, although it may be possible to create a linear light source by suitably selecting the configuration of the light-guiding plate, this light-emitting device essentially requires the employment of the light-guiding plate and a cylindrical lens in its structure, resulting in a large number of optical components, thus making the structure complicated and large in size.

Meanwhile, with respect to the installation of the laser diode, in the case of JP-A 2008-153617, the laser diode is fixed to a central portion of the CAN type package. Further, there is also proposed a light-emitting device wherein the laser diode is held inside a heat sink (see, for example, JP-A 2000-150991).

However, in the case of the light-emitting device of JP-A 2008-153617, the control of heat dissipation which requires for increasing the output of laser would become insufficient. Further, in the case of the light-emitting device disclosed in JP-A 2007-158991, although the heat dissipation is ensured by holding the laser diode inside the heat sink, it is impossible to control the spreading of light, thus making it difficult to efficiently utilize the light with the control of only a light source.

BRIEF SUMMARY OF THE INVENTION

It is an object of the present invention to provide a semiconductor light-emitting device using a laser diode as a light source, which has a narrow emission area and emits a linear white light of high luminance, and to provide a semiconductor light-emitting device which makes it possible to realize both high heat dissipation and high light-retrieval efficiency.

According to a first aspect of the present invention, there is provided a semiconductor light-emitting device comprising: a package having a light outlet; a semiconductor laser diode disposed in the package and radiating a light having a first wavelength falling within the range of ultraviolet ray to visible light; and a visible-light-emitter containing a phosphor which absorbs a light radiated from the semiconductor laser diode and emits a visible light having a second wavelength differing from the first wavelength, the visible-light-emitter being disposed on an optical path of the laser diode and a peripheral edge of the visible-light-emitter being in contact with the package.

According to a second aspect of the present invention, there is provided a semiconductor light-emitting device comprising: a package having a light outlet; a semiconductor laser diode disposed in the package and radiating a light having a first wavelength falling within the range of ultraviolet ray to visible light, the semiconductor laser diode being held, through its top and bottom surfaces, between a couple of heat sinks each having a tapered structure; and a visible-light-emitter containing a phosphor which absorbs a light radiated from the semiconductor laser diode and emits a visible light having a second wavelength differing from the first wavelength, the visible-light-emitter being disposed on an optical path of the semiconductor laser diode.

BRIEF DESCRIPTION OF THE SEVERAL VIEWS OF THE DRAWING

FIG. 1A is a planar cross-sectional view of a light-emitting device according to a first embodiment;

FIG. 1B is a cross-sectional view, as viewed from the front side, of the light-emitting device according to the first embodiment;

FIG. 1C is a perspective view of the light-emitting device according to the first embodiment;

FIG. 6A is a diagram for illustrating the principle of emission in the light-emitting device shown in FIGS. 5A-5C;

FIG. 6B is a cross-sectional view, as viewed from the front side, of the light-emitting device shown in FIG. 6A;

FIG. 7 is a planar cross-sectional view of a modified example of the light-emitting device according to the second embodiment;

FIG. 8 is a partial cross-sectional view of a visible-light-emitter;

FIG. 9 is a graph illustrating the relationship between the intensity of the light that cannot be absorbed by the phosphor and the product to be obtained by the thickness of a light-emitter and the concentration of a phosphor in the light-emitter;

FIG. 10 is a cross-sectional view showing an end-face emission type AlGaInN-based laser diode employed as a light-emitting element to be employed in a light emitting device according one embodiment of the present invention;

FIG. 11 is a cross-sectional view showing an end-face emission type MgZnO laser diode employed as a light-emitting element to be employed in a light emitting device according one embodiment of the present invention;

FIG. 12 is a cross-sectional view showing an end-face emission type MgZnO laser diode employed as a light-emitting element to be employed in a light emitting device according one embodiment of the present invention.

DETAILED DESCRIPTION OF THE INVENTION

Figure 2A:
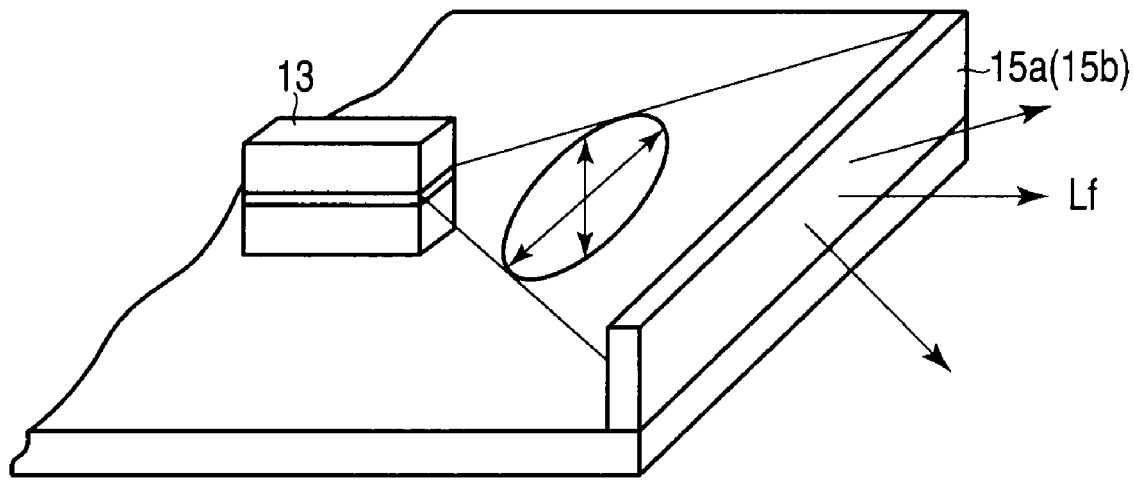
FIG. 2A is a diagram for illustrating the principle of emission in the light-emitting device shown in FIGS. 1A-1C.

Various embodiments of the present invention will be explained with reference to drawings. In the description of the drawings, the same or similar components will be identified by the same or similar reference numbers or symbols.

FIGS. 1A-1C show a light-emitting device according to a first embodiment of the present invention, wherein FIG. 1A is a planar cross-sectional view thereof, FIG. 1B is a cross-sectional view as viewed from the front side thereof, and FIG. 1C is a perspective view thereof. As shown in FIGS. 1A-1C, the light-emitting device according to the first embodiment of the present invention is constructed such that a light-emitting element 13 is contained in a package 10 which is constituted by a bottom part 11 and a top cover part 12. The light-emitting element 13 is mounted on a heat sink 14 which is secured to the sidewall of the bottom part 11. A couple of visible-light-emitters 15a and 15b are respectively disposed in each of the optical paths of the light-emitting element 13, these optical paths being located on the opposite sides (front side and rear side) of package 10.

The heat sink 14 is electrically insulated from the bottom part 11 and electrically connected with one of the electrodes of light-emitting element 13. Further, the other electrode of light-emitting element 13 is connected, through a bonding wire 17, with an interconnect layer 16 which is electrically insulated from the bottom part 11. The bottom part 11 and the interconnect layer 16 are respectively electrically connected with an external power source. A mirror (not shown) which is capable of reflecting laser beam and visible light is disposed on each of the surfaces of the bottom part 11 and of the top cover part 12, which face to the optical paths of laser beam.

Figure 2B:
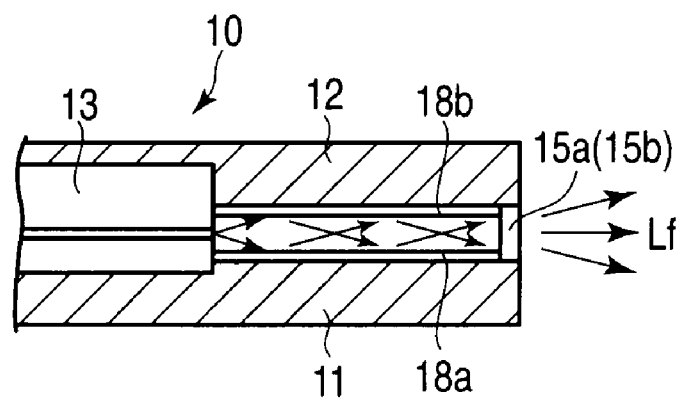
FIG. 2B is a cross-sectional view, as viewed from the front side, of the light-emitting device shown in FIG. 2A.

FIGS. 2A and 2B show respectively an optical path of the emission from the light-emitting element 13. As shown in FIG. 2B, a first mirror 18a is disposed on the bottom part 11 and under the optical path. Further, a second mirror 18b is disposed on the top cover part 12 and over the optical path. A space between the first mirror 18a and the second mirror 18b can be narrowed, at minimum, down to the ridge width of laser diode or to the laser-emitting width. Further, the maximum width of the space would be such that corresponds to the spreading angle of laser beam.

These visible-light-emitters 15a and 15b are disposed on the optical path of laser beam to be radiated from the light-emitting element 13 and are attached to the package 10. Accordingly, these visible-light-emitters 15a and 15b are in contact with the package 10.

The width of the longitudinal axis of each of the visible-light-emitters 15a and 15b can be determined by the spreading of the laser beam to be released from the light-emitting element 13. On this occasion, this width of the longitudinal axis may preferably be almost the same as that of the spreading of laser beam.

In order to obtain an emission having a fine linear cross-section, the visible-light-emitter may desirably be constructed such that it has a contour of a rectangular configuration, a polygonal configuration or an oval configuration each having an aspect ratio of 2:1 or more and that the longer axis thereof is the same in direction as the longer axis of the emission configuration of light to be emitted from the laser diode.

Since the visible-light-emitters 15a and 15b are only required to be disposed on the optical path of laser beam to be emitted from the light-emitting element 13, these visible-light-emitters 15a and 15b may not necessarily be required to be attached to the sidewall of package 10 as shown in FIGS. 1A-1C. However, it is more preferable to attach these visible-light-emitters 15a and 15b respectively to the light outlets located on the opposite sides of the package 10.

As shown in FIGS. 2A and 2B, the light-emitting element 13 is designed such that the excitation light Le ranging from ultraviolet ray to visible light and emitted therefrom is irradiated to these visible-light-emitters 15a and 15b. These visible-light-emitters 15a and 15b are enabled to absorb this excitation light Le and then emit a visible light. As a result, the visible light is emitted as a visible output light Lf having a fine linear cross-section from these visible-light-emitters 15a and 15b to the outside of the device.

Figure 3:
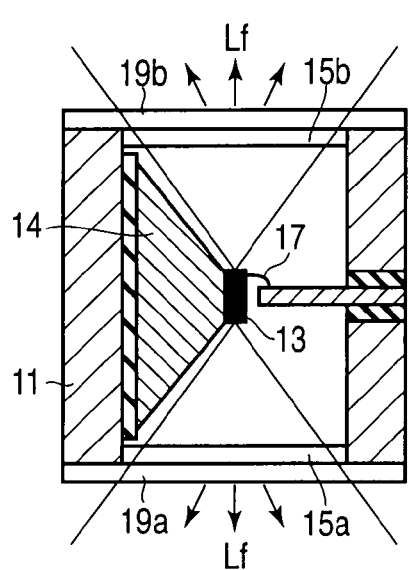
FIG. 3 is a planar cross-sectional view of a modified example of the light-emitting device according to the first embodiment.
Figure 4:
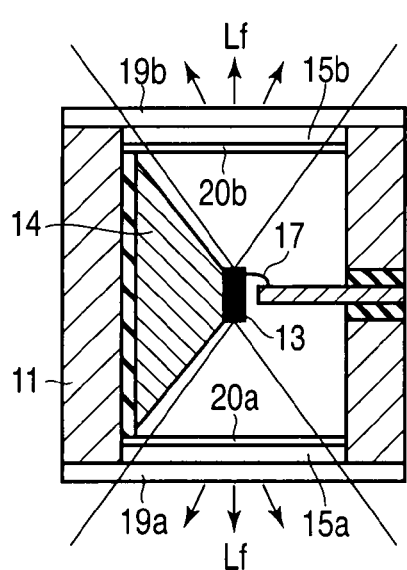
FIG. 4 is a planar cross-sectional view of another modified example of the light-emitting device according to the first embodiment.

Further, as shown in FIG. 3, optical filters 19a and 19b may be disposed on the opposite sidewalls of package 10 so as to be in contact with these visible-light-emitters 15a and 15b. Further, as shown in FIG. 4, optical filters 20a and 20b or films which are capable of transmitting the wavelength of the excitation light and also capable of reflecting visible light or a light having a wavelength of at least not less than 430 nm may be interposed between the light-emitting element 13 and the visible-light-emitters 15a and 15b. As for the optical filters 19 and 20, it is possible to employ a metallic film or a multi-layered dielectric film DBR, each having a reflectance of not less than about 80%, preferably not less than about 90% to the excitation light. Especially, the multi-layered dielectric film DBR may be designed, for example, such that it selectively reflects only the excitation light and permit the transmission of visible light and vice versa, thereby make it conform with the wavelength of excitation light.

As for the metal for the metallic film, it is possible to employ Al, Au, Ag, Pd, etc. As for the dielectric material for the multi-layered dielectric film, it is possible to employ oxides and nitrides of Si, Zr, Hf, Al, Ta, Ti, etc.

Alternatively, it is also possible to dispose a transparent plate-like or lens-like structure composed of, glass, metal or resin on the outer side of and in contact with the visible-light-emitter.

Figure 5A:
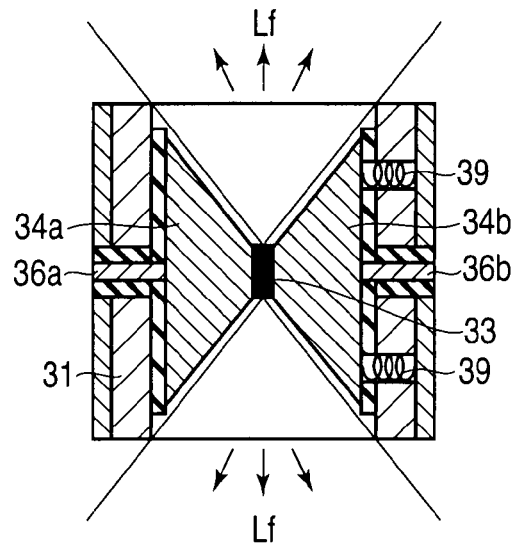
FIG. 5A is a planar cross-sectional view of a light-emitting device according to a second embodiment of the present invention.
Figure 5B:
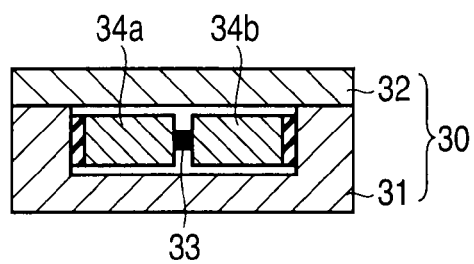
FIG. 5B is a cross-sectional view, as viewed from the front side, of the light-emitting device according to the second embodiment.
Figure 5C:
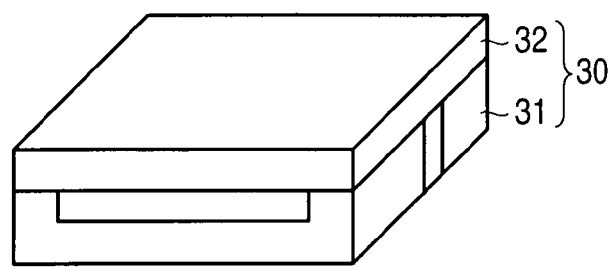
FIG. 5C is a perspective view of the light-emitting device according to the second embodiment.
Figure 13A:
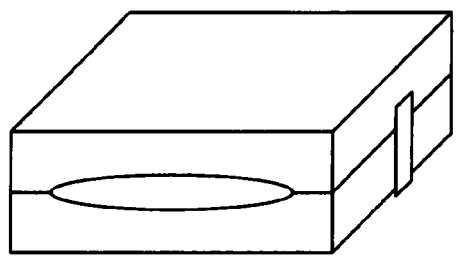
FIGS. 13A, 13B, 13C and 13D show respectively a perspective view illustrating various configurations of a visible-light-emitter.
Figure 13B:
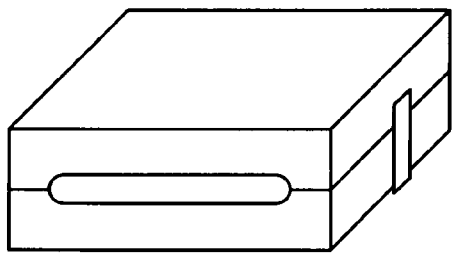
Figure 13C:
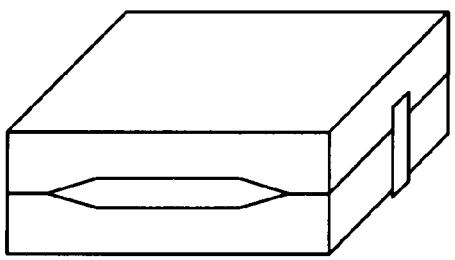
Figure 13D:
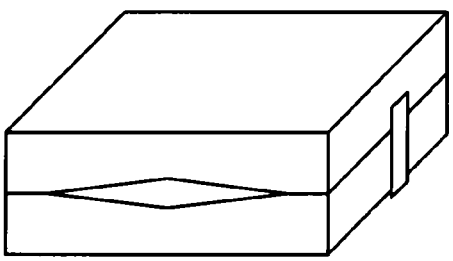

FIGS. 5A-5C show respectively the light-emitting device according to the second embodiment of the present invention, wherein FIG. 5A is a planar cross-sectional view thereof, FIG. 5B is a cross-sectional view thereof as it is viewed from the front side thereof, and FIG. 5C is a perspective view thereof. As shown in FIGS. 5A-5C, the light-emitting device according to the second embodiment of the present invention includes a package 30 and a light-emitting element 33 contained in the package 30. The package 30 has a bottom part 31 and a top cover part 32. The light-emitting element 33 is interposed between a couple of heat sinks 34a and 34b, both being secured to the sidewall of the bottom part 31.

These heat sinks 34a and 34b are electrically insulated from the bottom part 31. A couple of interconnect layers 36a and 36b are disposed in a manner to pass through the package 31 (these interconnect layers are omitted in FIG. 5B). Electrodes (not shown) disposed respectively on the upper and lower surfaces of the light-emitting element 33 are electrically connected with the interconnect layers through these heat sinks 34a and 34b.

At least one of the heat sinks 34a and 34b may be connected with the light-emitting element through solder or conductive pastes. In this case, the other heat sink is secured by spring action of a spring-like spacer 39 disposed between this heat sink and the bottom part 31.

Further, at least one of the heat sinks 34a and 34b is provided, on the contacting surface thereof to the light-emitting element 33, with a thick metallic film, thereby adhering the light-emitting element 33 to and thermally connected with at least one of the heat sinks 34a and 34b.

Furthermore, the heat sinks 34a and 34b may be sandwiched between the bottom part 31 and the top cover part 32, each being made of ceramics or metal at least having an insulating surface.

The heat that has been generated from the light-emitting element 33 is conducted, through the heat sinks 34a and 34b, to the package 30 and then dissipated out of the device. Because of the structure where heat is enabled to move from the opposite surfaces of light-emitting element 33 to the heat sinks 34a and 34b as described above, the heat resistance of light-emitting element 33 can be greatly lowered as compared with the conventional device, thereby making it possible to drive the light-emitting device at a higher output.

FIGS. 6A and 6B show the optical path of the light emitted from the light-emitting element 33. As shown in FIGS. 6A and 6B, under the optical path, a first mirror 38a is disposed on the bottom part 31 and, above the optical path, a second mirror 38b is disposed on the top cover part 32. A space between the first mirror 38a and the second mirror 38b can be narrowed, at minimum, down to the ridge width of laser diode or to the laser-releasing width. Further, the maximum width of the space would be such that corresponds to the spreading angle of laser beam.

FIG. 7 shows a modified example of the light-emitting device according to the second embodiment of the present invention shown in FIGS. 5A-5C. The light-emitting device shown in FIG. 7 differs from the light-emitting device shown in FIGS. 5A-5C in the respect that the visible-light-emitters 35a and 35b are respectively disposed in the optical path of the light emitted from the light-emitting element 33, and are located on the sidewalls (front side and rear side) of the package 30.

The width of the longitudinal axis of each of the visible-light-emitters 35a and 35b can be determined by the spreading of the laser beam to be released from the light-emitting element 33. On this occasion, this width of the longitudinal axis may more preferably be almost the same as that of the spreading of laser beam.

Since the visible-light-emitters 35a and 35b are only required to be disposed on the optical path of laser beam to be emitted from the light-emitting element 13, these visible-light-emitters 35a and 35b may not necessarily be required to be attached to the sidewall of package 30. However, it is more preferable to create a structure where these visible-light-emitters 35a and 35b are attached respectively to the sidewall of the package 30.

With respect to the features of the light-emitting device shown in FIG. 7 such as the optical path of the light emitted therefrom, the installation of mirror to be disposed at the lower surface and the upper surface of the optical path, and the installation intervals of mirrors, they are substantially the same as those of the light-emitting device according to the first embodiment.

Further, as in the case of the light-emitting device shown in FIG. 3, optical filters may be disposed on the both sidewalls of package 10 so as to join them to these visible-light-emitters 35a and 35b. Further, as in the case of the light-emitting device shown in FIG. 4, optical filters or films which are capable of transmitting a light of the same wavelength as that of the excitation light and also capable of reflecting visible light may be interposed between the light-emitting element 33 and the visible-light-emitters 35a and 35b. As for the optical filters, it is possible to employ a metallic film or a multi-layered dielectric film DBR, each having a reflectance of not less than about 80%, preferably not less than about 90% to the excitation light. Especially, the multi-layered dielectric film DBR may be designed such that, for example, it selectively reflects only the excitation light and permit the transmission of visible light and vice versa, thereby make it conform to the wavelength of excitation light as in the light-emitting devices shown in FIGS. 3 and 4.

FIG. 8 shows a cross-sectional view of a part of the visible-light-emitters 15a, 15b, 35a and 35b to be employed in the above embodiments. As shown in FIG. 8, the visible-light-emitters 15a, 15b, 35a and 35b respectively includes transparent base material 40 and phosphor particles 42 dispersed in the transparent base material 40. The excitation light Le that has been transmitted into visible-light-emitters 15a, 15b, 35a and 35b is absorbed by the phosphor particles 42 and is converted into visible light having a different wavelength from that of the excitation light Le.

The content of phosphor particles 42 contained in the transparent base material 40 can be adjusted so as enable the excitation light from the light-emitting elements 13 and 33 to be effectively absorbed and transmitted. More specifically, the light-emitters 15a, 15b, 35a and 35b may preferably contains the phosphor particles 42 dispersed in the transparent base material 40 at a content of about 5-75% by weight, preferably 25% by weight.

When the content of phosphor particles 42 is less than 5% by weight, the thickness of the visible-light-emitter would be required to be increased for enabling the visible-light-emitter to sufficiently absorb the excitation light, thereby rendering them to become too large in thickness to enable them to be installed in the device (if the size thereof confined to a prescribed size, it may become impossible to sufficiently absorb the excitation light). When the content of phosphor particles 42 is larger than 75% by weight, the thickness of the visible-light-emitter is caused to reduce and the content of the transparent base material is also caused to reduce, thereby rendering the visible-light-emitter to become brittle. As a result, the handling of the visible-light-emitter may become difficult.

As for the particle size of the phosphor particles 42, it may preferably be confined to 5-25 μm in particle diameter. It is especially desirable to employ those which are high in emission intensity and in emission efficiency and which contain large particles of as large as about 20 nm or more in particle diameter, for example. When the particle diameter of the phosphor particles 42 is less than 5 μm, the absorbency of the phosphor may become too low and the phosphor may be easily deteriorated, thus making them unsuitable for use. When the particle diameter of the phosphor particles 42 is larger than 25 μm, the molding of the visible-light-emitter may become difficult and discoloration may be more likely to be generated.

It has been found out through the experiments conducted by the present inventors that there is a predetermined relationship between the thickness of light-emitter and the concentration of the phosphor in the light-emitter (weight of phosphor/weight of light-emitter). Namely, the intensity I of the light that cannot be absorbed by the phosphor (the light that cannot be utilized as luminous light) among the excitation light emitted from the light-emitting elements 13 and 33 can be represented by the following equation.

$$I = I_0 e^{KCt}$$

$I_0$: Intensity of excitation light;
K: Coefficient
C: Concentration (weight) of the phosphor in the light-emitter;
t: Thickness (μm) of the light-emitter;

FIG. 9 shows a graph wherein ct is plotted on the abscissa and I is plotted on the ordinate.

It will be recognized from FIG. 9 that if the ct when the light that cannot be absorbed by the phosphor (leakage light) is not more than 10%, is set to about 100, it requires the employment of a light-emitter having a thickness of 400 μm where the concentration of phosphor is set to 25% by weight, or it requires the employment of a light-emitter having a thickness of 200 μm where the concentration of phosphor is set to 50% by weight.

Alternatively, the light-emitter may be formed of a sintered phosphor.

The light-emitting elements 13 and 33 to be employed in the light-emitting device according to above embodiment of the present invention may preferably be selected from those having an emission peak wavelength ranging from blue to ultraviolet in a wavelength region of not more than about 430 nm. More specifically, it is possible to employ a semiconductor laser diode or a light-emitting diode, wherein a III-V group compound semiconductor such as aluminum/gallium/indium nitride (AlGaInN) or a II-VI group compound semiconductor such as magnesium/zinc oxide (MgZnO) is used as a light-emitting layer (active layer).

For example, the III-V group compound semiconductor to be used as a light-emitting layer may be a nitride semiconductor containing at least one metal selected from the group consisting of Al, Ga and In. This nitride semiconductor can be specifically represented by $Al_xGa_yIn_{(1-x-y)}$ ($0 \leq x \leq 1$, $0 \leq y \leq 1$, $0 \leq (x+y) \leq 1$).

The nitride semiconductor of this kind includes a binary system such as AlN, GaN and InN; a ternary system such as $Al_xGa_{(1-x)}N$ ($0<x<1$), $Al_xIn_{(1-x)}N$ ($0<x<1$) and $Ga_yIn_{(1-y)}N$ ($0<y<1$); and a quaternary system containing all of these elements. Based on the compositions x, y and (1-x-y) of Al, Ga and In, the emission peak wavelength ranging from ultraviolet to blue can be determined.

Further, a part of the III group elements may be replaced by boron (B), thallium (Tl), etc. Further, a part of N of the V group elements may be replaced by phosphorus (P), arsenic (As), antimony (Sb), bismuth (Bi), etc.

Likewise, the II-VI group compound semiconductor to be used as a light-emitting layer is an oxide semiconductor containing at least one metal selected from Mg and Zn. More specifically, this oxide semiconductor may be represented by $Mg_zZn_{(1-z)}$ ($0 \leq z \leq 1$) and the emission peak wavelength of ultraviolet region can be determined based on the compositions z and (1-z) of Mg and Zn, respectively.

FIG. 10 is a cross-sectional view showing one example of an end face emission type AlGaInN-based laser diode which can be employed as the light-emitting elements 13 and 33. As shown in FIG. 10, this AlGaInN-based laser diode has a laminated structure including an n-type GaN substrate 100, on which an n-type GaN buffer layer 101, an n-type AlGaN clad layer 102, an n-type GaN optical guide layer 103, a GaInN light-emitting layer 104, a p-type GaN optical guide layer 105, a p-type AlGaN clad layer 106 and a p-type GaN contact layer 107 are successively laminated. An insulating film 108 is formed on the ridge sidewall of the p-type GaN contact layer 107 and on the surface of the p-type AlGaN clad layer 106. A p-type electrode 109 is formed on the surfaces of the p-type GaN contact layer 107 and of the insulating film 108. An n-side electrode 110 is formed on the back surface of the n-type GaN substrate 100.

FIGS. 11 and 12 illustrate respectively one example of the end face emission type MgZnO-based laser diode which can be employed as the light-emitting elements 13 and 33.

In the case of the MgZnO-based laser diode shown in FIG. 11, a silicon (Si) substrate 130 is employed. On the other hand, in case of the MgZnO-based laser diode shown in FIG. 12, a sapphire substrate 140 is employed.

The MgZnO-based laser diode shown in FIG. 11 has a laminated structure including a Si substrate 130, on which a metallic reflection layer 131, a p-type MgZnO clad layer 132, an i-type MgZnO light-emitting layer 133, an n-type MgZnO clad layer 134 and an n-type MgZnO contact layer 135 are successively laminated. An n-side electrode 136 is formed on the n-type contact layer 135. A p-side electrode 137 is formed on the substrate 130.

The MgZnO-based laser diode shown in FIG. 12 has a laminated structure including a sapphire substrate 140, on which a ZnO buffer layer 141, a p-type MgZnO clad layer 142, an MgZnO light-emitting layer 143 and an n-type MgZnO clad layer 144 are successively laminated. An n-side electrode 146 is formed, through an indium/tin oxide (ITO) electrode layer 145, on the n-type clad layer 144. A p-side electrode 148 is formed, through an ITO electrode layer 147, on the p-type MgZnO clad layer 142.

As for the materials for the transparent base material 40 of the light-emitters 15a, 15b, 35a and 35b, it is possible to employ any kind of material which can be easily permeated by the excitation light and is high in heat resistance. Specific examples of such materials include, for example, silicone resin, epoxy resin, urea resin, fluorinated resin, acrylic resin, polyimide resin, etc. Especially, in viewpoints of availability, easiness in handling and low cost, the employment of epoxy resin and silicone resin is more preferable. It is also possible, other than the aforementioned materials, to employ glass, a sintered body, and a ceramic structure formed of a combination of yttrium/aluminum/garnet (YAG) and alumina ($Al_2O_3$).

As for specific examples of the phosphor particles 42, it is possible to employ a material which is capable of absorbing the light of wavelength region ranging from ultraviolet to blue and also capable of radiating visible light. For example, it is possible to employ a fluorescent material such as a silicate-based fluorescent material, an aluminate fluorescent material, a nitride-based fluorescent material, a sulfide-based fluorescent material, an oxysulfide-based fluorescent material, a YAG-based fluorescent material, a borate-based fluorescent material, a phosphate/borate-based fluorescent material, a phosphate-based fluorescent material, a halo-phosphate-based fluorescent material, etc. The following are the compositions of each of these fluorescent materials.

(1) Silicate-based fluorescent material: $(Sr_{(1-x-y-z)}Ba_xCa_yEu_z)_2Si_wO_{(2+2w)}$ ($0 \leq x < 1$, $0 \leq y < 1$, $0.05 \leq z \leq 0.2$, $0.90 \leq w \leq 1.10$)

Among the silicate-based fluorescent materials represented by the aforementioned formula, it is more preferable to employ those having a composition where x=0.19, y=0, z=0.05, w=1.0. In order to stabilize the crystal structure and to enhance the emission intensity, a part of strontium (Sr), barium (Ba) and calcium (Ca) may be replaced by Ma and/or Zn.

It is also possible to employ other kinds of silicate-based fluorescent materials having a different composition ratio from those described above. For example, it is possible to employ $MSiO_3$, $MSiO_4$, $M_2SiO_3$, $M_2SiO_5$ and $M_4Si_2O_8$ (M is at least one element selected from the group consisting of Sr, Ba, Ca, Mg, Be, Zn and Y). Incidentally, for the purpose of controlling the luminescent color, a part of Si may be replaced by germanium (Ge) (for example, $Sr_{(1-x-y-z)}Ba_xCa_yEu_z)_2(Si_{(1-u)}Ge_u)_2O_4$). Further, at least one of the elements selected from the group consisting of Ti, Pb, Mn, As, Al, Pr, Tb and Ce may be contained therein as an activating agent.

(2) Aluminate-based fluorescent material: $M_4Al_{10}O_{17}$ (M is at least one element selected from the group consisting of Ba, Sr, Mg, Zn and Ca)

Eu and/or Mn may be contained as an activating agent.

It is also possible to employ other kinds of aluminate-based fluorescent materials having a different composition ratio from those described above. For example, it is possible to employ $MAl_2O_4$, $MAl_4O_7$, $MAl_8O_{13}$, $MAl_{12}O_{19}$, $M_2Al_{19}O_{17}$, $M_2Al_{11}O_{19}$, $M_3Al_5O_{12}$, $M_3Al_{16}O_{27}$ and $M_4Al_5O_{12}$ (M is at least one element selected from the group consisting of Ba, Sr, Ca, Mg, Be and Zn). Further, at least one of the elements selected from the group consisting of Mn, Dy, Tb, Nd and Ce may be contained therein as an activating agent.

(3) Nitride-based fluorescent material (mainly, silicon nitride-based fluorescent material): $L_xSi_yN_{(2x/3+4y/3)}$:Eu or $L_xSi_yO_zN_{(2x/3+4y/3-2z/3)}$:Eu (L is at least one element selected from the group consisting of Sr, Ca, Sr and Ca)

Among the aforementioned compositions, it is more preferable to employ those having a composition where x=2 and y=5 or x=1 and y=7. However, the values of these x and y may be optionally selected.

With respect to specific examples of the nitride-based fluorescent material which is represented by the above formula, it is preferable to employ fluorescent materials wherein Eu is added as an activating agent such as $(Sr_xCa_{(1-x)})_2Si_5N_8$:Eu, $Sr_2Si_5N_8$:Eu, $Ca_2Si_5N_8$:Eu, $Sr_xCa_{(1-x)}Si_7N_{10}$:Eu, $SrSi_7N_{10}$:Eu, $CaSi_7N_{10}$:Eu, etc. These fluorescent materials may contain at least one element selected from the group consisting of Mg, Sr, Ca, Ba, Zn, B, Al, Cu, Mn, Cr and Ni. These fluorescent materials may further contain, as an activating agent, at least one element selected from the group consisting of Ce, Pr, Tb, Nd and La.

(4) Sulfide-based fluorescent material: $(Zn_{(1-x)}Cd_x)S$:M (M is at least one element selected from the group consisting of Cu, Cl, Ag, Al, Fe, Cu, Ni and Zn; x is a number satisfying $0 \leq x \leq 1$)

Incidentally, S may be replaced by Se and/or Te.

(5) Oxysulfide-based fluorescent material: $(Ln_{(1-x)}Eu_x)O_2S$ (Ln is at least one element selected from the group consisting of Sc, Y, La, Gd and Lu; x is a number satisfying $0 \leq x \leq 1$)

Incidentally, at least one element selected from the group consisting of Tb, Pr, Mg, Ti, Nb, Ta, Ga, Sm and Tm may be contained therein as an activating agent.

(6) YAG-based fluorescent material: $(Y_{(1-x-y-z)}Gd_xLa_ySm_z)_3(Al_{(1-v)}Ga_v)_5O_{12}$:Ce,Eu ($0 \leq x \leq 1$, $0 \leq y \leq 1$, $0 \leq z \leq 1$, $0 \leq v \leq 1$,)

Incidentally, at least one element selected from Cr and Tb may be contained therein as an activating agent.

(7) Borate-based fluorescent material: $MBO_3$:Eu (M is at least one element selected from the group consisting of Y, La, Gd, Lu and In)

Incidentally, Tb may be contained therein as an activating agent.

It is also possible to employ other kinds of borate-based fluorescent materials having a different composition ratio from those described above, specific examples of which including $Cd_2B_2O_5$:Mn, (Ce, Gd, Tb)$MgB_5O_{10}$:M, $GdMgB_5O_{10}$:Ce,Tb, etc.

(8) Phosphate/borate-based fluorescent material: $2(M_{(1-x)}M'_x)O \cdot aP_2O_5 \cdot bB_2O_3$ (M is at least one element selected from the group consisting of Mg, Ca, Sr, Ba and Zn; M' is at least one element selected from the group consisting of Eu, Mn, Sn, Fe and Cr; and x, a and b respectively represent a number satisfying $0.001 \leq x \leq 0.5$, $0 \leq a \leq 2$, $0 \leq b \leq 3$, $0.3 < (a+b)$)

(9) Phosphate-based fluorescent material: $(Sr_{(1-x)}Ba_x)_3(PO_4)_2$:Eu or $(Sr_{(1-x)}Ba_x)_3P_2O_7$:Eu, Sn Incidentally, Ti and/or Cu may be contained therein as an activating agent.

(10) Halo-phosphate-based fluorescent material: $(M_{(1-x)}Eu_x)_{10}(PO_4)_6Cl_2$ or $(M_{(1-x)}Eu_x)_5(PO_4)_3Cl$ (M is at least one element selected from the group consisting of Ba, Sr, Ca, Mg and Cd; and x is a number satisfying $0 \leq x \leq 1$)

Incidentally, at least part of Cl may be replaced by fluorine (F). Further Sb and/or Mn may be contained therein as an activating agent.

The aforementioned fluorescent materials may be optionally selected to employ them as a blue light-emitter, a yellow light-emitter, a green light-emitter, a red light-emitter or a white light-emitter. Further, it is also possible to suitably combine plural kinds of fluorescent materials to create a light-emitter emitting an intermediate color. If it is desired to create a white light-emitter, three kinds of fluorescent materials each corresponding to three primary colors, i.e. red/green/blue (RGB), may be combined or alternatively additive complementary colors such as blue and yellow may be suitably combined to create a white light-emitter.

Further, although these combinations of colors are performed by a light-emitter including a mixture of a plurality of fluorescent material, it is also possible to create a multi-layered structure consisting of a plurality of layers each representing one kind of phosphor or to create a plurality of partitioned regions each representing one kind of fluorescent material. For example, a multi-layered structure consisting of a plurality of layers each representing each of RGB, is formed in a light-emitter. In this case, a layer of a fluorescent material emitting a light having a longer wavelength is disposed more close to the laser diode, thereby making it possible to obtain a light-emitting device which is capable of effectively radiating white light.

Further, when fluorescent materials corresponding to RGB are mixed in the same transparent base material, a light-emitting device where visible-light-emitters 15a, 15b, 35a and 35b are enabled to radiate individual white light can be obtained. If it is desired to secure the stability in terms of light-retrieving efficiency and tint, it is preferable to incorporate one kind of phosphor into each of the layers or regions of light-emitter, thereby creating the light of white color as a whole in the light-emitting device. On the other hand, if it is desired to attach importance to the easiness in the manufacture of light-emitter, it is preferable to create a structure where fluorescent materials are mixed together.

As for a material of the packages 10 and 30, it is preferable to employ a material which is excellent in heat conductivity. For example, it is possible to employ AlN, $Al_2O_3$, Cu, Cu alloys, BN, plastics, ceramics, diamond, etc. Further, as for a material of the heat sinks 14, 34a and 34b, it is preferable to employ a material which is excellent not only in electric conductivity but also in heat conductivity. For example, where the packages 10 and 30 and the heat sinks 14, 34a and 34b are made of materials such as Cu and Cu alloys, it is possible to effectively release the heat that may be generated during the operation of the light-emitting element 13 or 33.

With respect to a material of the interconnect layers 16, 36a and 36b, it is preferable to employ a material which is low in electric resistance and also low in absorption coefficient of visible light. For example, these interconnect layers may be formed of a metallic material such as Au, Ag, Cu, Cu alloys, W, etc. The interconnect layers 16, 36a and 36b may be constituted by a thin film or a thick film. In order to enhance the bondability, the interconnect layers 16, 36a and 36b may be covered with an Au-plated layer, an Ag-plated layer, a Pd-plated layer or a solder-plated layer.

With respect to a material of the boding wire 17, it is preferable to employ a material which is low in electric resistance and also low in absorption coefficient of visible light. For example, it is possible to employ an Au wire. Alternatively, a wire formed of a combination of a noble metal such as Pt and Au may be employed. Furthermore, by applying the plating of Au, etc., to the entire surface of the heat sink 12, the interconnects may be substantially integrated with the heat sink.

EXAMPLES

Next, various examples of the light-emitting device according to the embodiments of the present invention discussed above will be explained as follows.

Example 1

This example relates to the semiconductor light-emitting device shown in FIGS. 1A-1C.

First of all, the light-emitters 15a and 15b of the semiconductor light-emitting device shown in FIGS. 1A-1C, 2A and 2B were formed. As for a transparent base material for the visible-light-emitter, silicone resin was used. Light-emitters containing two kinds of fluorescent materials with each content of 50 wt %, which are dispersed in the transparent base material, are prepared. The two kinds of fluorescent materials have a relation of complementary colors enabling them to create white color.

As the two kinds of fluorescent materials, a blue color-emitting material containing a blue fluorescent material was employed, and a yellow color-emitting material containing a yellow fluorescent material was employed. More specifically, $(Sr, Ca, Ba)_{10}(PO_4)_6Cl_2$:Eu was employed as the blue fluorescent material and $(Sr, Ca, Ba)_2Si_2O_4$:Eu was employed as the yellow fluorescent material.

The printed circuit board 10 made of aluminum was constructed such that the surface thereof in contact with the heat sink was treated to make it electrically insulative and that facing the optical path thereof was worked to have a mirror-like surface. As for the material of the heat sink 14 functioning also as an interconnect, an Au-plated copper was employed. Further, the heat sink 14 was in contact with a copper wire, thereby enabling the heat sink 14 to electrically connect with an external power source (omitted in the drawing). A metallic film formed of Au, etc., was formed on the surface of the bottom part 11. Then, the metallic film thus formed was subjected to a patterning process by making use of photolithography, etching, etc., to thereby form interconnect layer 16 on the surface of the bottom part 11.

A semiconductor laser diode having an AlGaInN light-emitting layer generating bluish violet light was mounted, as a light-emitting element 13, on the surface of the heat sink 14. Subsequently, the interconnect layer 16 was electrically connected with the electrode (not shown) of the light-emitting element 13 by making use of a bonding wire 17.

The visible-light-emitters 15a and 15b were respectively disposed at each of the light outlets positioned respectively at an end portion of the package so as to make these visible-light-emitters face the light-emitting element 13. Further, these visible-light-emitters 15a and 15b were respectively fixed between the bottom part 11 and the top cover part 12, thereby bonding these visible-light-emitters to these components.

The space between mirror faces and the width of the shorter axis of each of the visible-light-emitters 15a and 15b were set to 0.4 mm which was equal to that of the light-emitting element 13. Further, the width of the longer axis of each of the visible-light-emitters 15a and 15b were set to 4 mm in conformity with the spreading of laser.

A couple of optical filters 20a and 20b for reflecting the light having a wavelength of not more than 420 nm were respectively disposed on the outside of the bottom part 11 and of the top cover part 12, thus contacting these optical filters with the visible-light-emitters 15a and 15b.

In the operation of the light-emitting device manufactured as described above, an operating voltage was applied between the electrodes of the light-emitting element 13 to oscillate a laser beam. The excitation light that was radiated from the light-emitting element 13 and directed toward the visible-light-emitters 15a and 15b was absorbed by each of these visible-light-emitters 15a and 15b and then white light was enabled to emit outside from the package 10. In this case, the light-emitting part of the light-emitting device was a linear light source having an aspect ratio of 1:10, and the emitted light was high brightness white light of 1000.

Example 2

This example relates to the semiconductor light-emitting device shown in FIGS. 5A-5C.

This semiconductor light-emitting device differs from the semiconductor light-emitting device of Example 1 in the respect that the light-emitting element 13 was sandwiched and fixed between a couple of heat sinks 34a and 34b. Namely, a laser diode 33 having an AlGaInN light-emitting layer emitting bluish violet light was mounted on the heat sink 34a by means of solder. Then, the other heat sink 34b having a thick gold film was disposed to face the surface of the laser diode, and was pressed and secured by spring-like spacers 39.

In the operation of the light-emitting device manufactured as described above, an operating voltage was applied between the electrodes of the light-emitting element 33 to drive the device. At this time, the heat resistance was 9K/W, thus obtaining a value which was lower by 50% as compared with the conventional package and the conventional mounting method. As a result, the rise in temperature of the light-emitting element 33 was suppressed, thereby making it possible to drive the laser diode at a higher current injection and a higher output.

Example 3

This example relates to the semiconductor light-emitting device shown in FIG. 7.

Silicone resin was used as the transparent base material for the light-emitter. Two kinds of fluorescent materials of 50 wt % respectively, having a complementary color relation and enabling to create white color, are dispersed in the transparent base material to form visible-light-emitters 35a and 35b containing these fluorescent materials.

As the two kinds of fluorescent materials, a blue color-emitting material containing a blue fluorescent material was employed, and a yellow color-emitting material containing a yellow fluorescent material was employed. More specifically, $(Sr, Ca, Ba)_{10}(PO_4)_6Cl_2$:Eu was employed as the blue fluorescent material and $(Sr, Ca, Ba)_2Si_2O_4$:Eu was employed as the yellow fluorescent material.

As shown in FIG. 7, the visible-light-emitters 35a and 35b thus obtained were respectively disposed at each of the light outlets positioned respectively at an end portion of the package 30 so as to make these visible-light-emitters face the light-emitting element 33. Further, these visible-light-emitters 15a and 15b were respectively interposed between the bottom part 31 and the top cover part 32, thereby fixing these visible-light-emitters to these components.

In the operation of the light-emitting device manufactured as described above, an operating voltage was applied between the electrodes of the light-emitting element 33 to drive the device. As a result, the excitation light emitted from the light-emitting element 33 and directed toward the visible-light-emitters 35a and 35b was absorbed by each of these visible-light-emitters 35a and 35b and then white light was enabled to output outside from the package 30, thus obtaining a linear white light source which was high in luminance and in output.

In the embodiments and examples of the present invention described above, the light-emitting devices each employing a visible-light-emitter which is capable of radiating white light have been explained. However, the present invention is not limited to the light-emitting devices employing a visible-light-emitter which is capable of radiating white light but can be also applied to light-emitting devices using a visible-light-emitter wherein visible light of other colors can be radiated. For example, a light-emitter which is capable of radiating red, orange, yellow, yellowish green, green, bluish green, blue, violet or white visible light may be also utilized depending on the end-use.

In the embodiments and examples of the present invention described above, the visible-light-emitters have been explained as having a contour of a rectangular configuration. However, the present invention is not limited to such a configuration but can be modified into various configurations. Examples of such various configurations are shown in FIGS. 13A-13D for instance.

As for the end-use of the light-emitting device according to the present invention, it includes ordinary lighting equipments, lighting equipments for business use, back-light for a liquid crystal display apparatus of televisions or personal computers, the lighting system of motor cars, motor bicycles or bicycles, etc.

Further, the present invention is not applied to the above-described embodiments per se but constituent elements of these embodiments may be variously modified in actual use thereof without departing from the spirit of the present invention. Further, the constituent elements described in these various embodiments may be suitably combined to create various inventions. For example, some of the constituent elements described in these embodiments may be deleted. Further, the constituent elements described in different embodiments may be optionally combined with each other.

What is claimed is:

1. A semiconductor light-emitting device comprising:
a package having a light outlet;
a semiconductor laser diode disposed in the package and radiating a light having a first wavelength falling within a range of ultraviolet ray to visible light; and
a visible-light-emitter containing a phosphor which absorbs a light radiated from the semiconductor laser diode and emits a visible light having a second wavelength differing from the first wavelength, said visible-light-emitter being disposed on an optical path of the laser diode and a peripheral edge of the visible-light-emitter being in contact with the package,
wherein the visible-light-emitter has a contour of a rectangular configuration, a polygonal configuration or an elliptical configuration, each having an aspect ratio of not less than 2:1, and a longer axis of a cross-sectional shape of a light emitted from the laser diode is the same in direction with a longer axis of the contour of the visible-light-emitter.

2. The device according to claim 1, wherein the visible-light-emitter contains at least one kind of phosphor particles which are dispersed in transparent resin, inorganic glass or crystal.

3. The device according to claim 1, wherein the visible-light-emitter is formed of a sintered phosphor.

4. The device according to claim 1, further comprising a transparent plate-like or lens-like structure composed of glass, metal or resin, which is disposed on an outside of and in contact with the visible-light-emitter.

5. A semiconductor light-emitting device comprising:
a package having a light outlet;
a semiconductor laser diode disposed in the package and radiating a light having a first wavelength falling within a range of ultraviolet ray to visible light, the semiconductor laser diode being held, through its top and bottom surfaces, between a couple of heat sinks each having a tapered structure; and
a visible-light-emitter containing a phosphor which absorbs a light radiated from the semiconductor laser diode and emits visible light having a second wavelength differing from the first wavelength, said visible-light-emitter being disposed on an optical path of the semiconductor laser diode.

6. The device according to claim 5, wherein one of said couple of heat sinks is connected with the semiconductor laser diode by means of solder or conductive pastes, or is thermally connected with the semiconductor laser diode through a metallic thick film which is adhered on a surface of said one of said couple of heat sinks which is connected to the semiconductor laser diode, and another heat sink is secured by a spring-like spacer disposed between said another heat sink and the package.

7. The device according to claim 5, wherein the package includes a bottom component and a cap component, and surfaces of these bottom component and cap component which face an optical path of the light emitted from the semiconductor laser diode are provided with a first mirror which reflects visible light and near ultraviolet ray, and a tapered surface of each of the heat sinks is formed of a second mirror.

8. The device according to claim 5, wherein said couple of heat sinks are held, through its top and bottom surfaces, by the package, at least the surface of which is formed of an insulating metal or ceramics.

9. The device according to claim 5, wherein the visible-light-emitter is disposed in the package in which a peripheral edge of the visible-light-emitter is in contact with the package.

10. The device according to claim 9, wherein the visible-light-emitter has a contour of a rectangular configuration, a polygonal configuration or an elliptical configuration, each having an aspect ratio of not less than 2:1, and a longer axis of a cross-sectional shape of a light emitted from the laser diode is the same in direction with a longer axis of the contour of the visible-light-emitter.

11. The device according to claim 5, wherein the visible-light-emitter contains at least one kind of phosphor particles which are dispersed in transparent resin, inorganic glass or crystal.

12. The device according to claim 5, wherein the visible-light-emitter is formed of a sintered phosphor.

13. The device according to claim 5, further comprising a transparent plate-like or lens-like structure composed of glass, metal or resin, which is disposed on an outside of and in contact with the visible-light-emitter.

14. The device according to claim 1, wherein the package includes a bottom component and a cap component, and surfaces of these bottom component and cap component which face an optical path of the light emitted from the semiconductor laser diode are provided with a mirror which reflects visible light and near ultraviolet ray.

15. The device according to claim 1, wherein the visible-light-emitter contains the phosphor at a content of 5-75% by weight.

16. The device according to claim 5, wherein the package includes a bottom component and a cap component, and surfaces of these bottom component and cap component which face an optical path of the light emitted from the semiconductor laser diode are provided with a mirror which reflects visible light and near ultraviolet ray.

17. The device according to claim 5, wherein the visible-light-emitter contains the phosphor at a content of 5-75% by weight.

* * * * *